(12) United States Patent
Keil et al.

(10) Patent No.: US 8,849,585 B2
(45) Date of Patent: Sep. 30, 2014

(54) METHODS FOR AUTOMATICALLY CHARACTERIZING A PLASMA

(75) Inventors: Douglas Keil, Fremont, CA (US); Jean-Paul Booth, Essone (FR); Christopher Thorgrimsson, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 363 days.

(21) Appl. No.: 12/477,007

(22) Filed: Jun. 2, 2009

(65) Prior Publication Data

US 2009/0322342 A1    Dec. 31, 2009

Related U.S. Application Data

(60) Provisional application No. 61/075,948, filed on Jun. 26, 2008.

(51) Int. Cl.
G01N 31/00 (2006.01)
G01R 27/26 (2006.01)
H01J 37/32 (2006.01)

(52) U.S. Cl.
CPC ..... *H01J 37/32954* (2013.01); *H01J 37/32935* (2013.01)
USPC ............................................. 702/32; 324/676

(58) Field of Classification Search
USPC ............................................. 702/32; 324/676
See application file for complete search history.

(56) References Cited

U.S. PATENT DOCUMENTS

| | | |
|---|---|---|
| 4,595,487 A | 6/1986 | Nunlist |
| 4,963,713 A | 10/1990 | Horiuchi et al. |
| 4,982,067 A | 1/1991 | Marantz et al. |
| 5,009,738 A | 4/1991 | Gruenwald et al. |
| 5,175,472 A | 12/1992 | Johnson, Jr. et al. |
| 5,473,162 A * | 12/1995 | Busch et al. ............... 250/341.6 |
| 5,936,413 A | 8/1999 | Booth et al. |
| 6,024,831 A | 2/2000 | Hwang et al. |
| 6,165,311 A | 12/2000 | Collins et al. |
| 6,218,312 B1 | 4/2001 | Collins et al. |
| 6,291,072 B1 | 9/2001 | Kimoto et al. |

(Continued)

FOREIGN PATENT DOCUMENTS

| | | |
|---|---|---|
| JP | 2007-037817 A | 2/1995 |
| JP | 2001-144071 A | 5/2001 |

(Continued)

OTHER PUBLICATIONS

"International Preliminary Report on Patentability", Issued in PCT Application No. PCT/US2009/048747; Mailing Date: Jan. 13, 2011.

(Continued)

*Primary Examiner* — John Breene
*Assistant Examiner* — Manuel Rivera Vargas

(57) ABSTRACT

A method for automatically characterizing plasma during substrate processing is provided. The method includes collecting a set of process data, which includes at least data about current and voltage. The method also includes identifying a relevancy range for the set of process data, wherein the relevancy range includes a subset of the set of process data. The method further includes determining a set of seed values. The method yet also includes employing the relevancy range and the set of seed values to perform curve-fitting, wherein the curve-fitting enables the plasma to be automatically characterized.

9 Claims, 10 Drawing Sheets

(56) References Cited

U.S. PATENT DOCUMENTS

| | | | |
|---|---|---|---|
| 6,440,260 B1 | 8/2002 | Denda et al. | |
| 6,447,691 B1 | 9/2002 | Denda et al. | |
| 6,833,710 B2 | 12/2004 | Benveniste | |
| 6,894,474 B2 | 5/2005 | Cox et al. | |
| 6,902,646 B2 * | 6/2005 | Mahoney et al. | 156/345.24 |
| 7,067,432 B2 | 6/2006 | Xu et al. | |
| 7,093,560 B2 | 8/2006 | Tong et al. | |
| 7,334,477 B1 | 2/2008 | Pirkle | |
| 7,374,636 B2 | 5/2008 | Horioka et al. | |
| 7,413,672 B1 * | 8/2008 | Keil | 216/59 |
| 7,479,207 B2 | 1/2009 | Kimball et al. | |
| 7,994,794 B2 | 8/2011 | Kimball et al. | |
| 2001/0025691 A1 | 10/2001 | Kanno et al. | |
| 2002/0011213 A1 | 1/2002 | Ramiah et al. | |
| 2002/0024338 A1 | 2/2002 | Saho et al. | |
| 2002/0139478 A1 | 10/2002 | Ma et al. | |
| 2003/0038114 A1 | 2/2003 | Howald | |
| 2003/0210510 A1 | 11/2003 | Hann et al. | |
| 2004/0004708 A1 | 1/2004 | Willis | |
| 2004/0107906 A1 | 6/2004 | Collins et al. | |
| 2005/0032253 A1 | 2/2005 | Hsu et al. | |
| 2005/0103439 A1 | 5/2005 | Goodman | |
| 2005/0211384 A1 | 9/2005 | Hayashi | |
| 2005/0212450 A1 | 9/2005 | Martinez et al. | |
| 2006/0021970 A1 * | 2/2006 | Parsons | 216/59 |
| 2006/0150913 A1 | 7/2006 | Wang et al. | |
| 2007/0080138 A1 * | 4/2007 | Hoffman et al. | 216/59 |
| 2007/0162172 A1 | 7/2007 | Tanaka et al. | |
| 2007/0215285 A1 | 9/2007 | Kimball et al. | |
| 2008/0066861 A1 | 3/2008 | Kimball et al. | |
| 2009/0007642 A1 | 1/2009 | Busby et al. | |
| 2010/0006417 A1 | 1/2010 | Booth et al. | |
| 2010/0007337 A1 | 1/2010 | Booth et al. | |
| 2010/0007359 A1 | 1/2010 | Booth et al. | |
| 2010/0007362 A1 | 1/2010 | Booth et al. | |
| 2010/0008015 A1 | 1/2010 | Booth et al. | |
| 2010/0033195 A1 | 2/2010 | Booth et al. | |

FOREIGN PATENT DOCUMENTS

| | | |
|---|---|---|
| JP | 2008-016517 A | 1/2008 |
| KR | 10-0378187 B1 | 3/2003 |
| KR | 10-2004-0024720 A | 3/2004 |
| KR | 10-2007-0035346 A | 3/2007 |
| KR | 10-2008-0048310 A | 6/2008 |

OTHER PUBLICATIONS

"International Preliminary Report on Patentability", Issued in PCT Application No. PCT/US2009/049756; Mailing Date: Jan. 20, 2011.
"International Preliminary Report on Patentability", Issued in PCT Application No. PCT/US2009/049757; Mailing Date: Jan. 20, 2011.
"International Preliminary Report Patentability", Issued in PCT Application No. PCT/US2009/049759; Mailing Date: Jan. 20, 2011.
"International Preliminary Report on Patentability", Issued in PCT Application No. PCT/US2009/049760; Mailing Date: Jan. 20, 2011.
"International Preliminary Report on Patentability", Issued in PCT Application No. PCT/US2009/049761; Mailing Date: Jan. 20, 2011.
"International Search Report", Issued in PCT Application No. PCT/US2009/049759; Mailing Date: Feb. 3, 2010.
"Written Opinion", Issued in PCT Application No. PCT/US2009/049759; Mailing Date: Feb. 3, 2010.
"International Search Report", Issued in PCT Application No. PCT/US2009/048747; Mailing Date: Feb. 11, 2010.
"Written Opinion", Issued in PCT Application No. PCT/US2009/048747; Mailing Date: Feb. 11, 2010.
"International Search Report", Issued in PCT Application No. PCT/US2009/049757; Mailing Date: Feb. 23, 2010.
"Written Opinion", Issued in PCT Application No. PCT/US2009/049757: Mailing Date: Feb. 23, 2010.
"International Search Report",Issued in PCT Application No. PCT/US2009/049760; Mailing Date: Feb. 23, 2010.
"Written Opinion", Issued in PCT Application No. PCT/US2009/049760; Mailing Date: Feb. 23, 2010.
"International Search Report", Issued in PCT Application No. PCT/US2009/049762; Mailing Date: Feb. 24, 2010.
"Written Opinion", Issued in PCT Application No. PCT/US2009/049762; Mailing Date: Feb. 24, 2010.
"International Search Report", Issued in PCT Application No. PCT/US2009/049756; Mailing Date: Mar. 2, 2010.
"Written Opinion", Issued in PCT Application No. PCT/US2009/049756; Mailing Date: Mar. 2, 2010.
"International Search Report", Issued in PCT Application No. PCT/US2009/049761; Mailing Date: Feb. 24, 2010.
"Written Opinion", Issued in PCT Application No. PCT/US2009/049761; Mailing Date: Feb. 24, 2010.
"Non Final Office Action", U.S. Appl. No. 12/498,939, Mailing Date: Oct. 20, 2011.
"internationai Preliminary Report on Patentability", Issued in PCT Application No. PCT/US2009/049762; Mailing Date: Jan. 20, 2011.
"Notice of Allowance", U.S. Appl. No. 12/498,934, Mailing Date: Nov. 28, 2011.
"Non Final Office Action", U.S. Appl. No. 12/498,934, Mailing Date: Dec. 7, 2011.
"Final Office Action", U.S. Appl. No. 12/498,939, Mailing Date: Mar. 15, 2012.
"Non Final Office Action", U.S. Appl. No. 12/498,940, Mailing Date: Oct. 9, 2012.
"Non Final Office Action", U.S. Appl. No. 12/498,939, Mailing Date: Oct. 9, 2012.
"Final Office Action", U.S. Appl. No. 12/498,940, Mailing Date: Apr. 23, 2012.

* cited by examiner

METHODS FOR AUTOMATICALLY CHARACTERIZING A PLASMA

PRIORITY CLAIM

This application is related to and claims priority under 35 U.S.C. §119(e) to a commonly assigned provisional patent application entitled "Methods For Automatically Characterizing A Plasma," by Keil et al., Application Ser. No. 61/075,948, filed on Jun. 26, 2008, which is incorporated by reference herein.

BACKGROUND OF THE INVENTION

Advances in plasma processing have provided for growth in the semiconductor industry. To supply chips for a typical electronic product, hundreds or thousands of substrates (such as semiconductor wafers) may be processed. In order for the manufacturing company to be competitive, the manufacturing company needs to be able to process the substrates into quality semiconductor devices with minimal processing time.

Typically, during plasma processing, problems may arise that may cause the substrates to be negatively impacted. One important factor that may alter the quality of the substrate being processed is the plasma itself. In order to have sufficient data to analyze the plasma, sensors may be employed to collect processing data about each substrate. The data collected may be analyzed in order to determine the cause of the problems.

To facilitate discussion, FIG. 1 shows a simple schematic diagram of a data collecting probe in a portion of a plasma system 100. Plasma system 100 may include a radio frequency (RF) source 102, such as a pulsating RF frequency generator, capacitively-coupled to a reactor chamber 104 to produce plasma 106. When RF source 102 is turn on, a bias voltage is developed across an external capacitor 108, which may be about 26.2 nanofarads (nF). In an example, RF source 102 may provide a small burst of power (e.g., 11.5 megahertz.) every few milliseconds (e.g., about five milliseconds) causing external capacitor 108 to be charged. When RF source 102 is turned off, a bias voltage remains on external capacitor 108 with a polarity such that probe 110 is biased to collect ions. As the bias voltage decays, the curves as shown in FIGS. 2A, 2B and 3 may be traced.

Those skilled in the art are aware that probe 110 is usually an electrical probe with a conducting planar surface that may be positioned against the wall of reactor chamber 104. Probe 110 is thus directly exposed to reactor chamber 104 environment. Current and voltage data collected by probe 110 may be analyzed. Since certain recipe may cause a non-conducting deposition layer 116 to be deposited on probe 110, not all probes may be able to collect reliable measurements. However, those skilled in the art are aware that a PIF (planar ion flux) probe enables data to be collected despite the non-conducting deposition layer since the PIF probe scheme is not required to draw a direct current (DC) to implement a measurement.

The current and voltage signal in plasma system 100 is measured by other sensors. In example 100, when RF source 102 is switched off, current sensor 112 and a high impedance voltage sensor 114, are employed to measure die current and the voltage, respectively. The measurement data collected from current sensor 112 and voltage sensor 114 may then be plotted to create a current graph and a voltage graph. The data may be manually plotted or the data may be entered into a software program to create the graphs.

FIG. 2A shows a graph of voltage versus time after a RF charge cycle. At data point 202, RF source 102 has been switched off after an RF charge has been provided (i.e., RF burst). In this example, at data point 202, the voltage across probe 110 is about negative 57 volts. As plasma system 100 returns to a rest state (interval between data points 204 and 206), the voltage usually reaches a floating voltage potential. In this example, the floating voltage potential rises from about negative 57 volts to about zero volt. However, the floating voltage potential does not have to be zero and may be a negative or a positive bias voltage potential.

Similarly, FIG. 2B shows a graph of current data collected after a RF charge. At data point 252, RF source 102 has been switched off after an RF charge has been provided. During a decay period 254, the return current at external capacitor 108 may be discharged. In an example, at full charge (data point 252), the current is about 0.86 mA/cm$^2$. However, when the current is fully discharged (data point 256), the current has returned to zero. Based on the graph, the discharge takes about 75 milliseconds. From data point 256 to data point 258, the capacitor remains discharged.

Since both the current data and the voltage data are collected over a period of time, a current versus voltage graph may be generated by coordinating the time in order to eliminate the time variable. In other words, the current data collected may be matched against the voltage data collected. FIG. 3 shows a simple current versus voltage graph for a single time interval between a RF burst. At data point 302, RF source 102 has been switched off after an RF charge has been provided.

By applying a non-linear fit to the data collected during each RF burst, plasma 106 may be characterized. In other words, parameters (e.g., ion saturation, ion saturation slope, electron temperature, floating voltage potential, and the like) that may characterize plasma 106 may be determined. Although plasma 106 may be characterized with the data collected, the process of calculating the parameters is a tedious manual process that requires human intervention. In an example, when the data has been collected after each RF burst (i.e., when the RF charge has been provided and then turned off), the data may be fed into a software analysis program. The software analysis program may perform a non-linear fit to determine the parameters that may characterize the plasma. By characterizing the plasma, the engineer may be able to determine how a recipe may be adjusted in order to minimize substandard processing of the substrates.

Unfortunately, the prior art method of analyzing the data for each RF burst may require several seconds or as much as several minutes to complete. Since there are typically thousands, if not millions of RF bursts to analyze, the total time for characterizing the plasma for a recipe may take hours to calculate. As a result, the prior art method is not an effective method in providing timely relevant data for process control purposes.

BRIEF SUMMARY OF THE INVENTION

The invention relates, in an embodiment, to a method for automatically characterizing plasma during substrate processing. The method includes collecting a set of process data, which includes at least data about current and voltage. The method also includes identifying a relevancy range for the set of process data, wherein the relevancy range includes a subset of the set of process data. The method further includes determining a set of seed values. The method yet also includes employing the relevancy range and the set of seed values to perform curve-fitting, wherein the curve-fitting enables the plasma to be automatically characterized.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Figure 1:
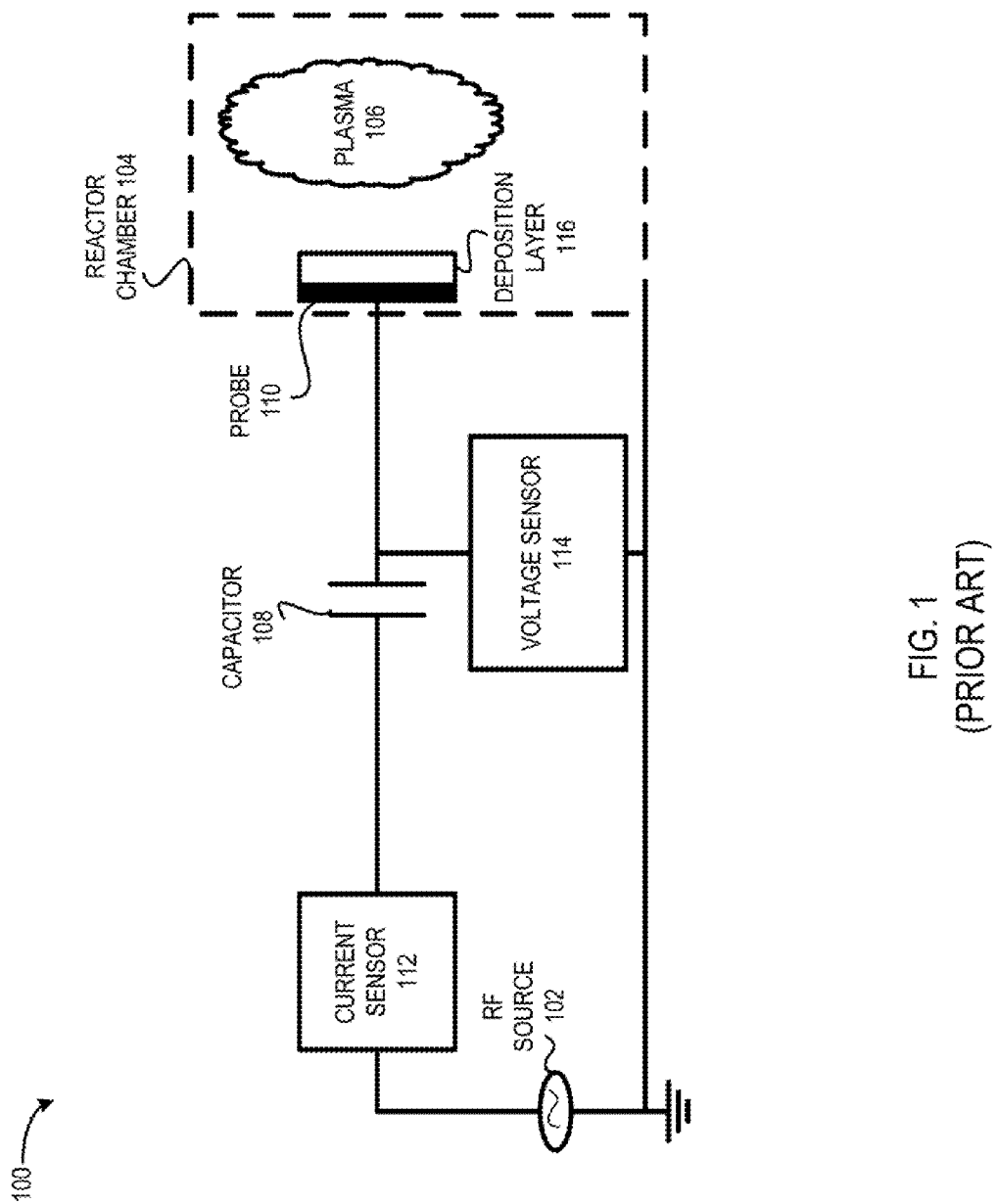
FIG. 1 shows a simple schematic diagram of a portion of a plasma system with a radio frequency (RF) source capacitively-coupled to a reactor chamber to produce plasma.
Figure 2A:
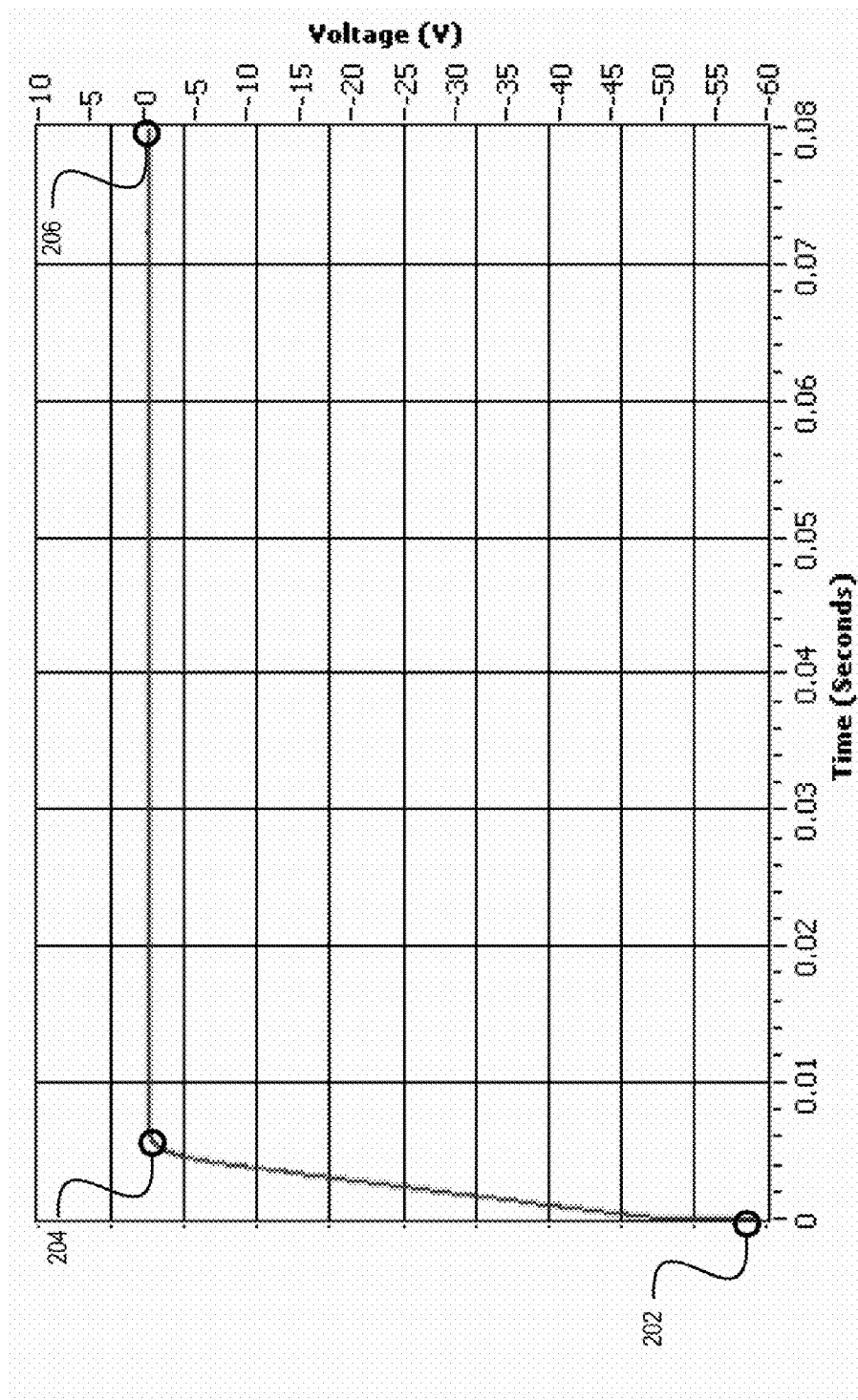
FIG. 2A shows a graph of voltage versus time after a RF charge.
Figure 2B:
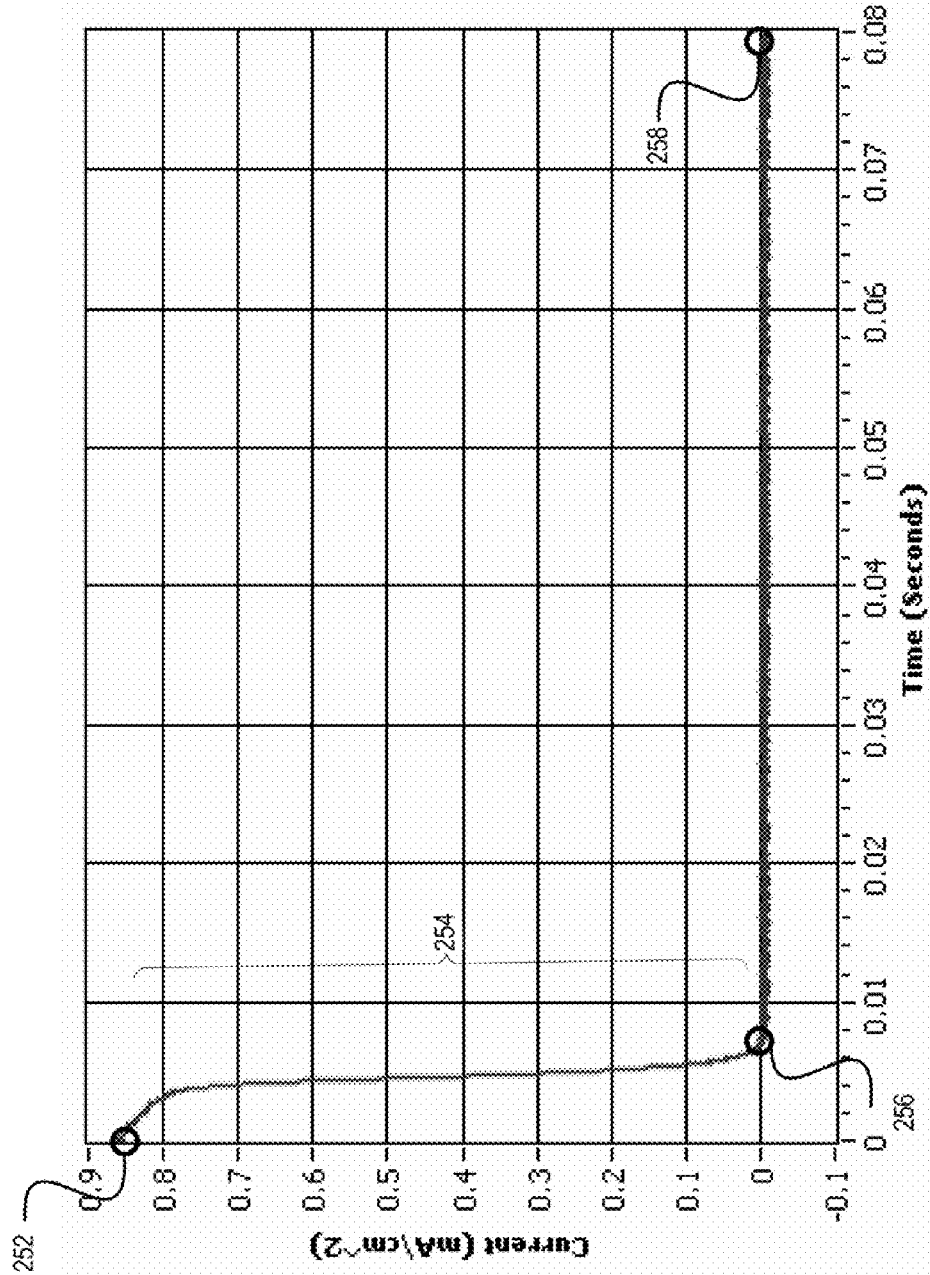
FIG. 2B shows a graph of current data collected after a RF charge.
Figure 3:
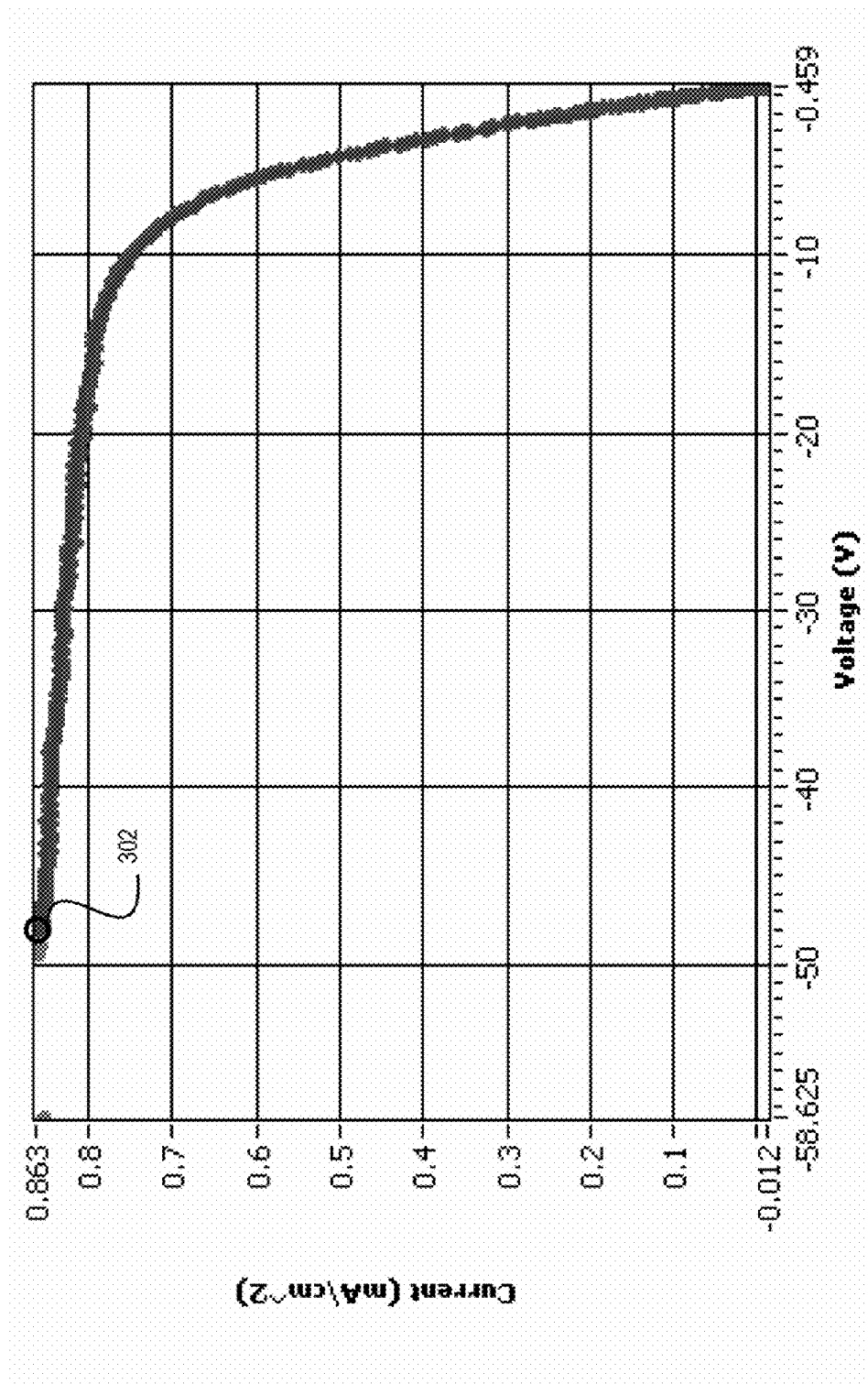
FIG. 3 shows a simple current versus voltage graph for a single time interval between a RF burst.

As aforementioned, the PIF probe method may be employed to collect data about the plasma that may be positioned within the reactor chamber environment. Data collected from a sensor (e.g., PIF probe) may be employed to characterize the plasma in the reactor chamber. Additionally, since the sensor employs a collection surface as shown in FIG. 1, data about the chamber surface may also be determined. In the prior art, the data collected by the PSD probe provides a ready source of data that is available for analysis. Unfortunately, the sheer volume of data that may be collected has made analyzing the data in a timely manner a challenge. Since thousands or even millions of data points may be collected, the task of identifying the relevant interval in order to accurately characterize a plasma may be a daunting task, especially since the data is usually being analyzed manually. As a result, the data collected has not been useful in providing the plasma processing system with a timely characterization of the plasma.

However, if relevant data points that are needed in order to characterize a plasma are identified from the thousands/millions of data points that may be collected, then the time required to characterize a plasma may be significantly reduced. In accordance with embodiments of the invention, a method is provided for automatically characterizing plasma in a relatively short time period. Embodiments of the invention described herein provide for an algorithm for identifying the relevancy range in order to reduce the data points that may need to be analyzed in order to characterize a plasma. As discussed herein, the relevancy range refers to a smaller set of data points from the thousands or millions of data points that may be gathered between each RF burst. Embodiments of the invention further provide for estimating seed values that may be applied to a mathematical model that calculates the values for characterizing a plasma. By performing curve-fitting to the relevancy range, parameters that may be employed to characterize a plasma may be calculated.

The features and advantages of the present invention may be better understood with reference to the figures and discussions that follow.

Figure 4:
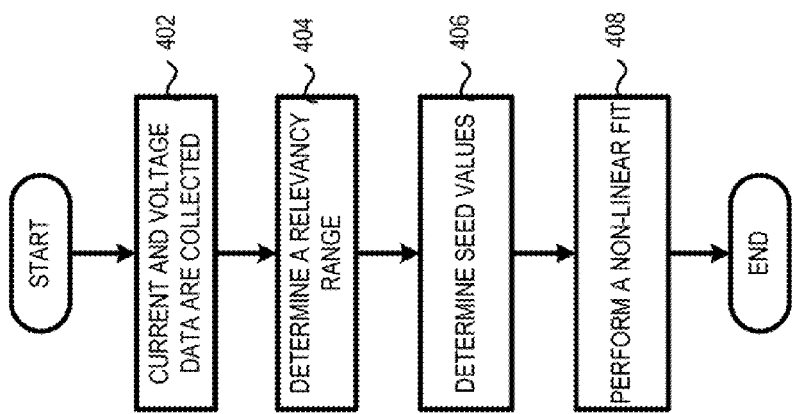
FIG. 4 shows, in an embodiment of the invention, a simple flow chart illustrating the overall steps for automatically characterizing plasma during substrate processing.

FIG. 4 shows, in an embodiment of the invention, a simple flow chart illustrating the steps for automatically characterizing plasma during substrate processing. Consider the situation wherein, an RF charge has been provided during substrate processing.

At a first step 402, current and voltage data are collected. In an example, after the RF source has been turned on, an RF charge (pulse) is provided. After the RF charge has been turn off, a current sensor and a voltage sensor may be employed to collect data at a probe, such as a planar ion flux probe, which may be mounted to a chamber wall of the reactor chamber. As aforementioned, the number of data points that may be collected by the sensors may range in the thousands or millions. In some cases, thousands to ten of thousands of data points may be collected between each RF burst making near-real-time analysis in the prior art nearly impossible.

In the prior art, several hours may be allotted for analyzing the measurement data that is collected during semiconductor substrate processing. In one aspect of the invention, the inventors herein realized that the measurement data between each RF burst does not have to be analyzed in order to characterize a plasma. Instead, if curve-fitting is applied to a relevancy range of the data set, parameters that may be employed to characterize the plasma may be determined.

At a next step 404, a relevancy range is determined. As aforementioned, tie relevancy range refers to a subset of the data set that has been collected between each RF burst. In the prior art, since the data is being manually analyzed, the sheer volume of the data collected make calculating the relevancy range a challenging task. In many instances, the relevancy range may be visually estimated. In identifying the relevancy range, noises that may exist may be substantially eliminated from the subset of data set. In an example, during complex substrate processing, a polymer buildup may occur on the probe, causing a portion of the data collected to be skewed. For example, the portion of the data that may be impacted tends to be the data that may be collected once the capacitor has been fully discharged. In identifying the relevancy range, data associated with the polymer buildup may be removed from the analysis. In other words, the determination of the relevancy range may enable plasma characterization to occur without being subject to random noises. Discussion about how a relevancy range may be determined, for an example, is provided later in the discussion of FIG. 5.

In addition to identifying the relevancy range, the seed values may also be determined, at a next step 406. As discussed herein, the seed values refer to the estimated value of the slope, the electron temperature, the ion saturation value, the floating voltage potential, and the like. Discussion about how the seed values may be estimated, for example, is provided in the discussion of FIG. 5.

The relevance range and the seed values are utilized to perform curve-fitting. Since curve-fitting has to be performed before the next RF burst, the methods employed to determine the relevancy range and/or seed values have to utilize minimum overhead and produce values that are close to the final fit values, thereby reducing number of curve-fitting iterations that may be required in order to achieve a rapid convergence.

With the relevancy range and the seed values, at a next step 408, a non-linear fit (e.g., curve-fitting) may be performed, thereby enabling the plasma to be characterized within a shorter time period without requiring an expensive high-end computer. Unlike the prior art, the method allows for results from a decay interval due to a single RF burst to be characterized in approximately 20 milliseconds instead of requiring a few minutes or even a few hours to process. With near-realtime analysis capability, the method may be applied as part of an automatic control system to provide the engineer with relevant data during plasma processing.

Figure 5:
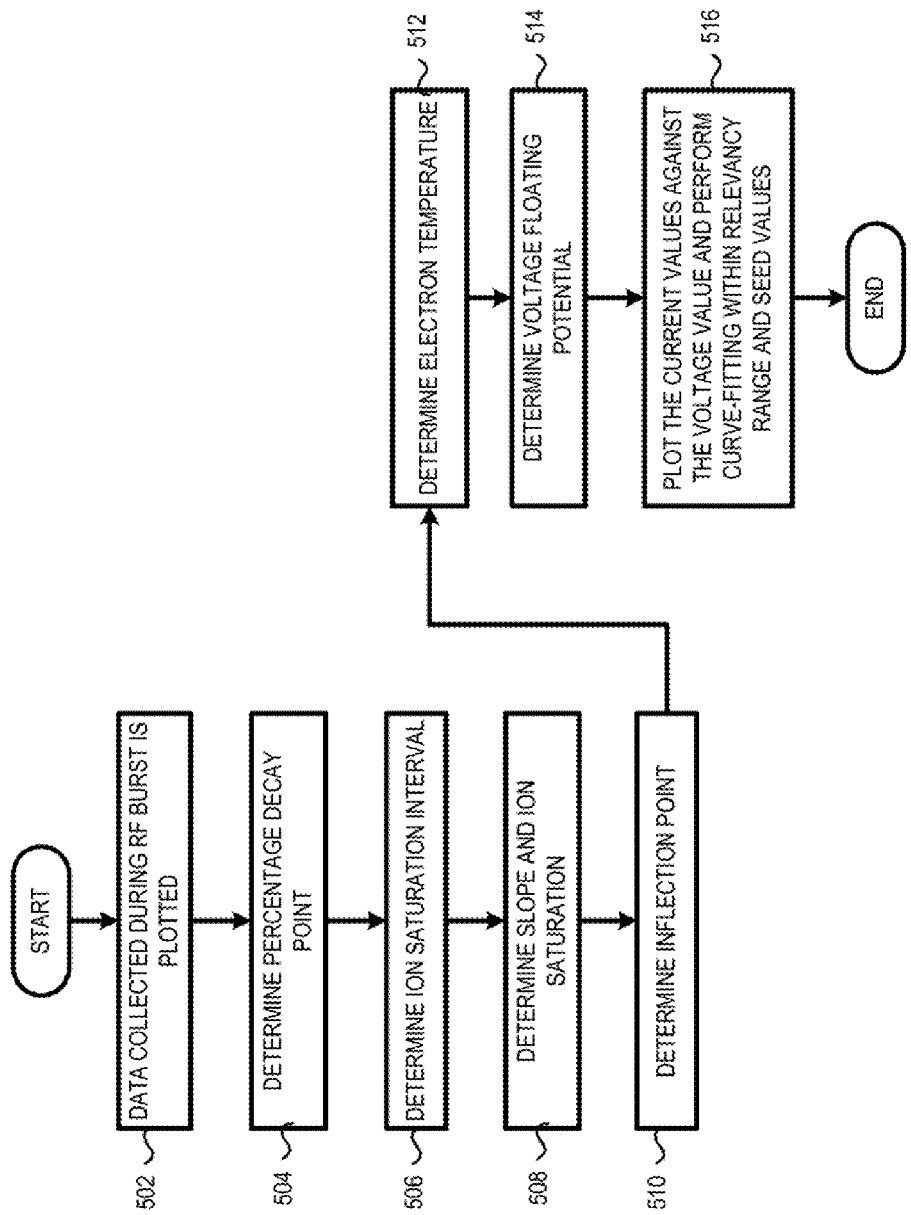
FIG. 5 shows, in an embodiment of the invention, a simple algorithm for determining the relevancy range and the seed values.

FIG. 5 shows, in an embodiment of the invention, a simple algorithm for determining the relevancy range and the seed values. FIG. 5 will be discussed in relation to FIGS. 6A, 6B, 6C, and 6D

At a first step 502, the data collected during each RF burst is automatically plotted. In an example, the current data that may be collected by the current sensor is plotted into a current versus lime graph 600, such us the one shown in FIG. 6A. In another example, the voltage data collected may be plotted into a voltage versus time graph 650, as shown in FIG. 6B. Although the data may produce similar graphs as the prior art, unlike the prior art, the data collected is automatically fed into the analysis program without requiring human intervention. Alternatively, the measurement data collected does not have to be plotted. Instead, the data may be fed directly into the analysis program. Instead, the graphs are provided as visual examples to explain the algorithm.

Unlike the prior art, the entire data set is not analyzed in order to characterize a plasma. Instead, a relevancy range is determined. To determine the relevancy range, a percentage decay point may first be determined, at a next step 504. As discussed herein, the percentage decay point refers to the data point at which the original value has decayed to a certain percentage of the original value. In an embodiment, the percentage decay point may represent the end of the data interval to be analyzed. In an example, when the RF source is switched off, the current value is about 0.86 mA/cm$^2$. The value is represented by a data point 602 on graph 600 of FIG. 6A. If the percentage decay point is set to ten percent of the original value, the percent decay point is at data point 604, which is about 0.086 mA/cm$^2$. In other words, the percentage decay point may be determined by applying a pre-defined percentage to the original value, which is value of the electrical charge when the RF source is switched off and the system is returning to an equilibrium state. In an embodiment, the percentage is empirically determined. In an embodiment, instead of employing a percentage decay point to determine the end of the data interval, the peak of a first derivative of the data collected for each RF burst may be calculated.

At a next step 506, the algorithm may determine the ion saturation interval, which is the data subset between the original value and a second decay point. As discussed herein, the ion saturation interval refers to the region of the current-voltage (IV) curve at which the probe potential is sufficiently negative with respect to the floating potential such that the electron flux to the probe is negligible. In this region the current to the probe increases slowly and linearly with increasingly negative potential. In addition, the ion saturation interval is the regime at which the bias voltage is sufficiently negative with respect to the floating potential such that the probe will collect all the available ions in the system. In other words, the collected current "saturates" as the bias voltage is raised sufficiently high. Also, as discussed herein, the "available ions" refers to the flux of ions impinging upon the sheath boundary, which may enlarge as the bias voltage is further increased.

Figure 6A:
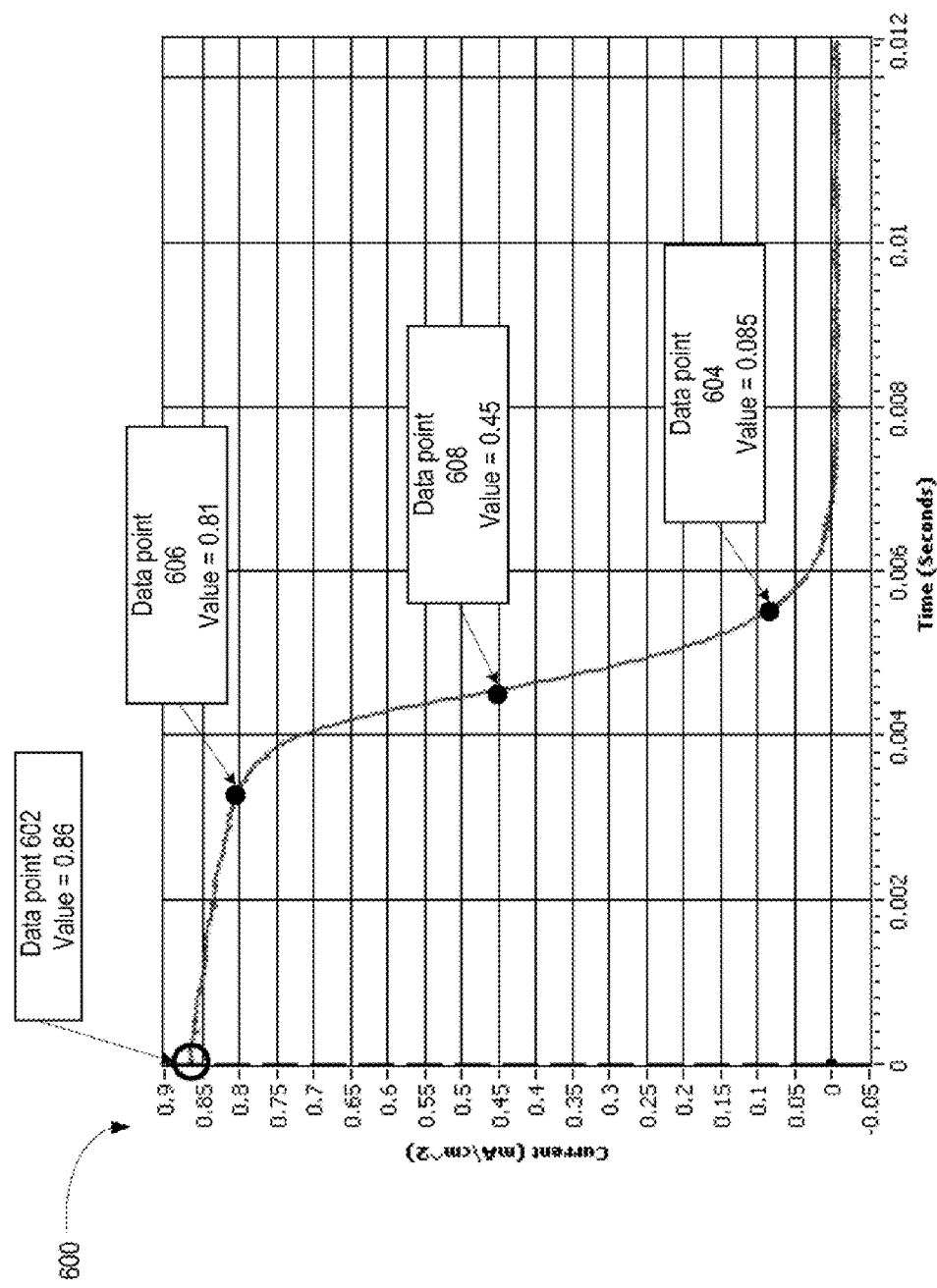
FIG. 6A shows an example of current versus time after a RF burst.
Figure 6B:
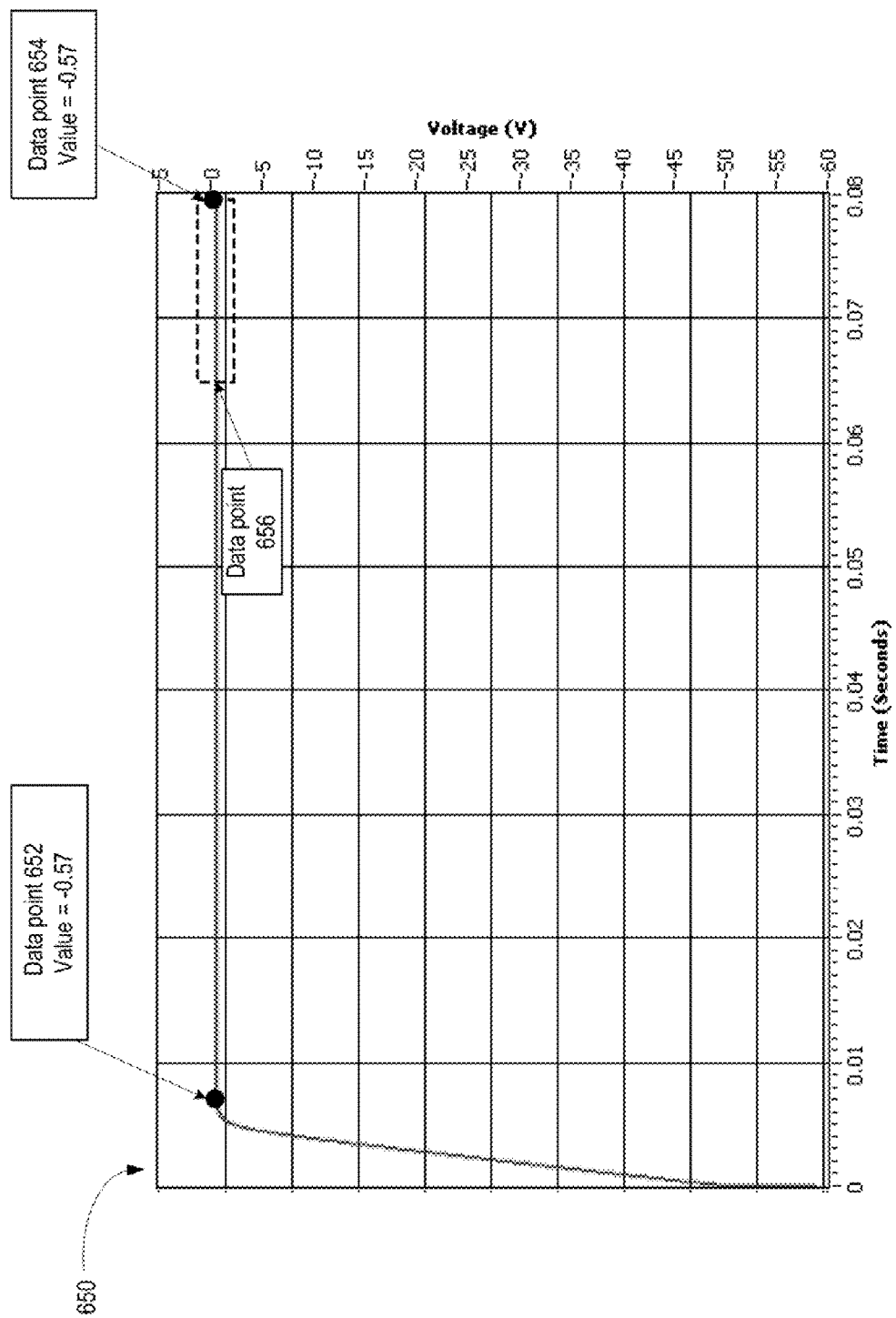
FIG. 6B shows an example of voltage versus time after a RF burst.

In other words, the ion saturation interval is the interval from data points 602 and 606 of FIG. 6A. In an embodiment, the second decay point may be determined by taking a percentage of the original value (i.e., data point 602). In an example, if the second decay point is about 95 percent of the original value, the second decay point is about 0.81 mA/cm$^2$ (i.e., data point 606). Hence, the ion saturation interval is from the original value (data point 602) to the second decay point (data point 606). Note that the second decay point (such as data point 608) is between the original value (data point 602) and the percentage decay point (data point 604). Similar to the percentage decay point, the second decay point may also be based on a pre-defined threshold, in an embodiment. In an embodiment, the percentage is empirically determined.

Once the ion saturation interval has been determined, at a next step 508, the slope (s) and the ion saturation ($i_o$) may be estimated. As aforementioned, the slope (s) and the ion saturation ($i_o$) are two of the four seed values that may be applied to a mathematical model (Equation 2 below) to determine the parameters that characterize a plasma. In an example, the slope(s) may be determined by performing linear regression. In another embodiment, the algorithm may also determine the ion saturation ($i_o$) by taking the average of the data values between data points 602 and 606.

Figure 6C:
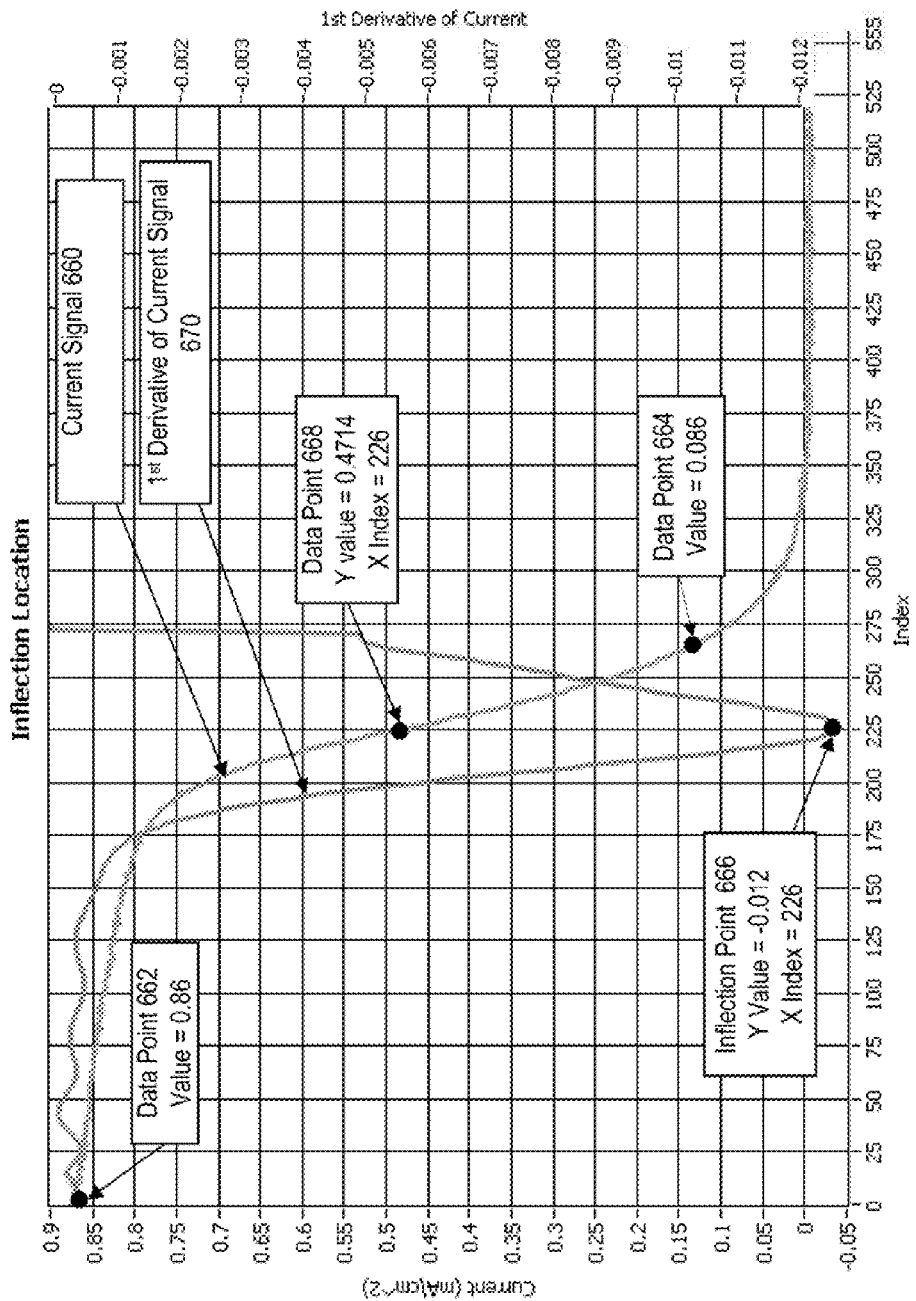
FIG. 6C shows an example of an inflection point.

At a next step 510, the algorithm may determine the inflection point, which is the point at which the first derivative changes sign. In an embodiment, the inflection point may be calculated by identifying the minimal value of the first derivative of the current values between the percentage decay point and the second decay point. To illustrate, FIG. 6C shows the first derivative of the values between a percentage decay point (664) and an original point (662) of a current signal 660. The inflection point is the minimal data point of the first derivative (670), which has a value of −0.012 mA/cm² and an index value of 226 (as shown by data point 666). To determine the inflection value, the index value is mapped to current signal plot 660. In this example, when the index value of the first derivative is mapped to current signal 660, the inflection value is 0.4714 mA/cm², as shown by data point 668.

In an embodiment, the relevancy range is defined as the range between the original value and the inflection point. Additionally or alternatively, a percent decay threshold may be set (e.g., at 35 percent) instead of calculating the inflection point. In an example, using the percent decay point of 35 percent, which may be empirically determined, the relevancy range may fall between points 602 and 604 of FIG. 6A.

$$T_e = \text{abs}\left(\frac{I_{meas}(t)}{\left(\frac{dI_{meas}}{dV_{meas}}\right)}\right) = \text{abs}\left(\frac{I_{meas}(t)}{\left(\frac{dI_{meas}}{dt}\right)\left(\frac{dt}{dV_{meas}(t)}\right)}\right) \quad \text{[Equation 1]}$$

TABLE 1

Parameters defined

| Parameters | Variable name |
|---|---|
| $I_{meas}$ | Current measured |
| $V_{meas}$ | Voltage measured |
| t | Current time |
| $T_e$ | Electron temperature |

With the inflection point identified, the electron temperature may be estimated, at a next step 512. The electron temperature may be estimated by employing Equation 1 above. The current and voltage data utilized to calculate the electron temperature is within the transition interval, which is usually when a probe is drawing less current than the ion saturation current. In an embodiment, the time at which the current and voltage data is measured may correspond with the inflection point. Alternatively, the inflection point of the current-voltage (I-V) curve may also be employed. Since the electron temperature is a ratio of a first derivative (as determined in calculating the percentage decay point) of the data collected for an RF burst at a time corresponding to the inflection point on the current-voltage curve, the computational overhead that may be required to generate the number is minimal.

At a next step 514, the algorithm may determine the floating voltage potential. Since the floating voltage potential is determined based on the voltage data collected, the floating voltage potential may be determined without first having to determine the values as calculated in steps 504-512. Those skilled in the art are aware that floating voltage potential is the electrical potential at which the probe floats after the external capacitor has fully discharged. Typically, the floating voltage potential may be determined by looking at the signal that occurs right before the next RF burst. However, due to the possibility of polymer buildup causing distortion, erroneous data (i.e., noise) may be collected; thus, the floating voltage potential may be calculated by averaging the voltage values collected toward the end of the collection period. In an embodiment, the floating voltage potential may be calculated from data point 652 (the data point at which the voltage first reaches its floating potential) to data point 654 (the data point just right before the next RF burst), as shown in FIG. 6B. In another embodiment, the floating voltage potential may be based on the voltage values within a window 656, which is located between data points 652 and 654, as shown in FIG. 6B. In an embodiment, window 656 may be of any size as long as the window begins before the prior pulse has decayed more than 99 percent and ends when the next pulse begins. In one embodiment, the floating voltage potential may be determined from a window that provides an average value with a low standard deviation (error).

As can be appreciated from the foregoing, the methods for determining the relevancy range and the seed values account for anomalies that may occur in the current, voltage and/or current-voltage (I-V) curves. In an example, polymer buildup may occur at the end of an RF burst. However, by applying the aforementioned algorithms, the relevancy range and the seed values are impervious to unexpected artifacts that may occur during processing.

Figure 6D:
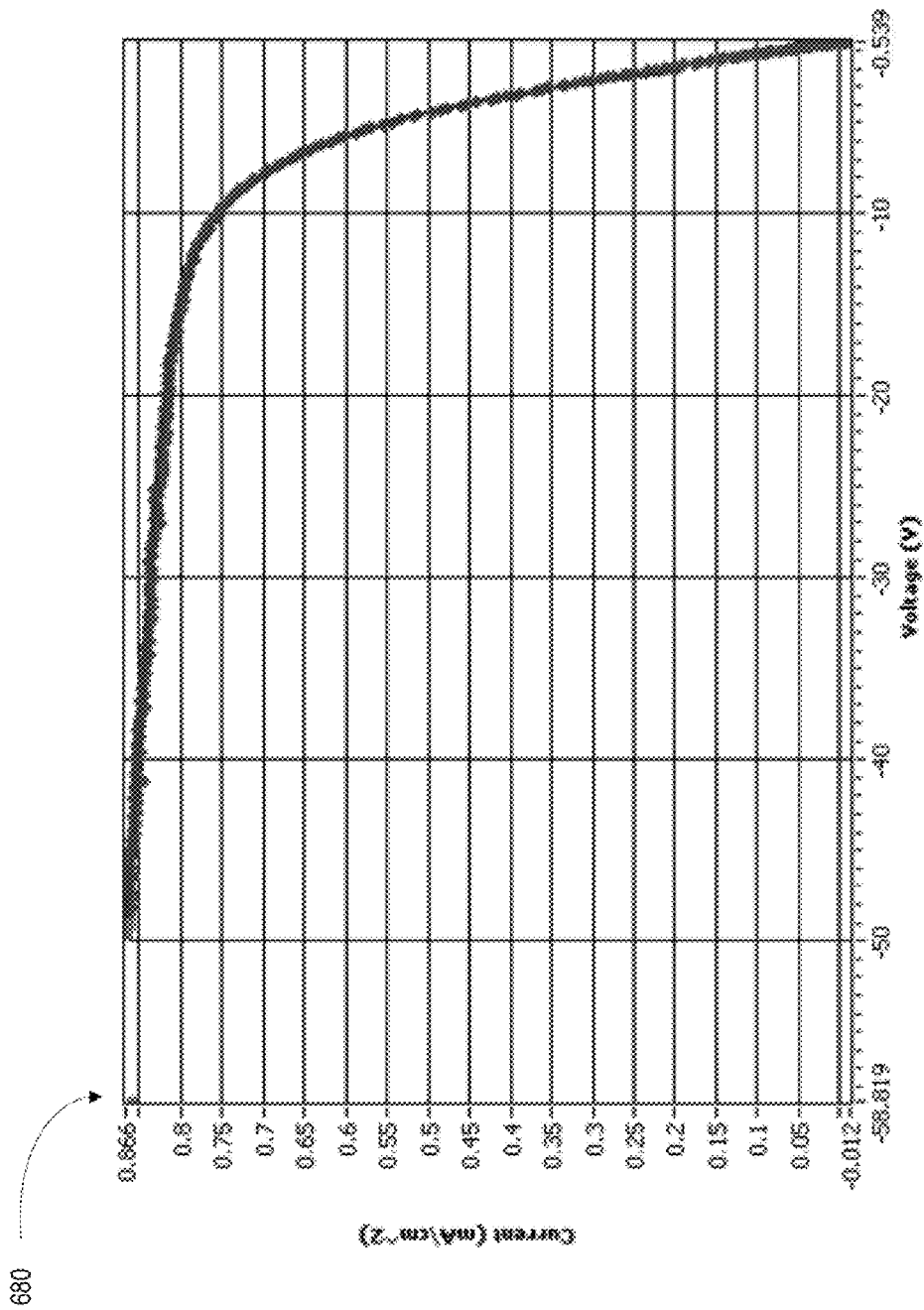
FIG. 6D shows an example of a curve-fitting applied to a current versus voltage graph.

Once the relevancy range has been determined and the seed values have been calculated, at a next step 516, the current values may be plotted against the voltage values and curve-fitting may be applied to generate graph 680 of FIG. 6D. In an example, a non-linear curve fit, such as Levenberg-Marquardt algorithm, may be applied to perform the curve-fitting. By generating a curve-fitting graph and applying the seed values to the mathematical model such as Equation 2 below, the four parameters that may be employed to characterize the plasma may be determined.

$$I = I_0\left\{1 - s^*(V - V_f) - \exp\left[\frac{(V - V_f)}{T_e}\right]\right\} \quad \text{[Equation 2]}$$

TABLE 2

Parameters defined

| Parameters | Variable name |
|---|---|
| I | Current |
| $I_o$ | Ion saturation |
| S | Slope |
| V | Voltage |
| $V_f$ | Floating voltage potential |
| $T_e$ | Electron temperature |

As can be appreciated from one or more embodiments of the present invention, an automated method for characterizing plasma during plasma processing is provided. By determining a relevancy range and a set of seed values, plasma characterization may occur without having to process thousands or millions of data points that are usually collected after a single RF burst. The automated method transforms a previously tedious and manual process into an automatic task that may be performed quickly and efficiently. With data analysis significantly shortened from a few minutes (or even a few hours) to a few milliseconds, plasma characterization may be performed during plasma processing instead of being a post-production process. Thus, relevant data may provide insights into the current plasma environment, thereby enabling recipe and/or tool adjustment to occur and waste to be minimized.

While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for automatically characterizing plasma during substrate processing in a plasma processing system, comprising:
    arranging a probe in a plasma processing chamber of said plasma processing system;
    connecting one end of a capacitor to said probe;
    selectively supplying an RF signal including RF bursts to another end of said capacitor;
    collecting a set of process data from said probe during substrate processing by measuring current supplied to said other end of said capacitor and voltage at said one end of said capacitor;
    identifying a relevancy range for said set of process data, wherein said relevancy range includes a subset of said set of process data collected after said capacitor begins discharging after one of said RF bursts and before said capacitor is fully discharged after said one of said RF bursts;
    determining a set of seed values based on said process data in said relevancy range; and
    employing said relevancy range and said set of seed values as initial values for curve fitting corresponding to said one of said RF bursts to reduce a number of curve-fitting iterations.

2. The method of claim 1 wherein:
    said identifying said relevancy range includes at least one of calculating a peak of a first derivative of said set of process data, and determining a percentage decay point, said percentage decay point represents a level below an original data value corresponding to an end of one of said RF bursts, and
    wherein said relevancy range is between said original data value and said percentage decay point.

3. The method of claim 2 wherein:
    said identifying said relevancy range further includes identifying an inflection point,
    said relevancy range is represented by a range between said original data value and said inflection point,
    said inflection point being a first derivative of said current values between said percentage decay point and a second decay point,
    said second decay point being between said original data value and said percentage decay point.

4. The method of claim 3 wherein said set of seed values includes a slope, an electron temperature, an ion saturation value, and a floating voltage potential.

5. The method of claim 4 wherein said determining said set of seed values includes determining an ion saturation interval, wherein said ion saturation interval corresponds to an interval from said original data value to said second decay point.

6. The method of claim 5 wherein said slope is determined by performing a linear regression of said ion saturation interval.

7. The method of claim 6 wherein said ion saturation value is determined by averaging data values within said ion saturation interval.

8. The method of claim 7 wherein said electron temperature is determined by taking a first derivative of data collected at said inflection point.

9. The method of claim 8 wherein said floating voltage potential is determined by averaging voltage data collected from an initial floating voltage potential point to a data point before a second RF charge.

* * * * *

UNITED STATES PATENT AND TRADEMARK OFFICE
CERTIFICATE OF CORRECTION

PATENT NO. : 8,849,585 B2  
APPLICATION NO. : 12/477007  
DATED : September 30, 2014  
INVENTOR(S) : Douglas Keil, Jean-Paul Booth and Christopher Thorgrimsson It is certified that error appears in the above-identified patent and that said Letters Patent is hereby corrected as shown below:

Title Page, Item (56) References:

| | |
|---|---|
| Page 2, Column 2, Line 37 | Delete "international" and insert --International-- |

In the Specification:

| | |
|---|---|
| Column 1, Lines 39-40 | Delete "megahertz.)" and insert --megahertz)-- |
| Column 1, Line 62 | Delete "die" and insert --the-- |
| Column 5, Line 2 | Delete "tie" and insert --the-- |
| Column 5, Line 53 | Delete "lime" and insert --time-- |
| Column 5, Line 53 | Delete "us" and insert --as-- |
| Column 6, Line 55 | Delete "slope(s)" and insert --slopes (s)-- |

Signed and Sealed this  
Fourteenth Day of April, 2015

Michelle K. Lee  
*Director of the United States Patent and Trademark Office*